United States Patent
Li et al.

(10) Patent No.: US 9,601,361 B2
(45) Date of Patent: Mar. 21, 2017

(54) FIXTURE FOR CONVEYING A MASK PLATE FOR THE PRODUCTION OF THIN FILM TRANSISTOR LIQUID CRYSTAL DISPLAY

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanqiu Li, Beijing (CN); Chongxi Wei, Beijing (CN); Wei Li, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 214 days.

(21) Appl. No.: 14/406,350

(22) PCT Filed: May 6, 2014

(86) PCT No.: PCT/CN2014/076852
§ 371 (c)(1),
(2) Date: Dec. 8, 2014

(87) PCT Pub. No.: WO2015/051637
PCT Pub. Date: Apr. 16, 2015

(65) Prior Publication Data
US 2016/0268151 A1 Sep. 15, 2016

(30) Foreign Application Priority Data
Oct. 11, 2013 (CN) .......................... 2013 1 0473332

(51) Int. Cl.
*H01L 21/677* (2006.01)
*B25J 15/00* (2006.01)
(Continued)

(52) U.S. Cl.
CPC ..... *H01L 21/67706* (2013.01); *B25J 11/0095* (2013.01); *B25J 15/0052* (2013.01);
(Continued)

(58) Field of Classification Search
CPC ........................ H01L 21/67706; B25J 11/0095
(Continued)

(56) References Cited

U.S. PATENT DOCUMENTS 2,783,078 A * 2/1957 Billner .................. B66C 1/0212
294/2
3,261,637 A * 7/1966 Bopp ........................ B66C 1/62
294/110.1
(Continued)

FOREIGN PATENT DOCUMENTS

CN 200990375 Y 12/2007
CN 200992806 12/2007
(Continued)

OTHER PUBLICATIONS

First Office Action, App. No. 2013104733327, dd Mar. 23, 2015.
(Continued)

*Primary Examiner* — Paul T Chin
(74) *Attorney, Agent, or Firm* — Bakerhostetler LLP

(57) ABSTRACT

A fixture for conveying a mask plate comprising: a conveying bracket; and a fixation structure that is arranged on the conveying bracket and configured to fix the mask plate to be conveyed. The fixture has the following advantageous effects: it is able to prevent the hands from being in direct contact with the mask plate, thereby reducing the risk of conveyance damage of the mask plate which improves the operation efficiency.

15 Claims, 2 Drawing Sheets

(51) Int. Cl.
  *B25J 11/00* (2006.01)
  *H01L 21/673* (2006.01)
  *H01L 21/687* (2006.01)
  *G02F 1/13* (2006.01)
  *H01L 27/12* (2006.01)

(52) U.S. Cl.
  CPC ...... *G02F 1/1303* (2013.01); *H01L 21/67346* (2013.01); *H01L 21/67721* (2013.01); *H01L 21/68728* (2013.01); *H01L 27/1288* (2013.01)

(58) Field of Classification Search
  USPC .... 294/81.51, 81.5, 81.54, 81.3, 103.1, 104, 294/106, 113, 114, 115, 117
  See application file for complete search history.

(56) References Cited

U.S. PATENT DOCUMENTS

| | | | | |
|---|---|---|---|---|
| 3,306,646 | A * | 2/1967 | Flora, Jr. | B66C 1/427 294/106 |
| 3,695,667 | A * | 10/1972 | Dempsey | B66C 1/28 294/81.21 |
| 5,775,000 | A * | 7/1998 | Maekawa | H01L 21/68728 134/902 |
| 6,062,620 | A * | 5/2000 | Walker | B66C 1/28 294/67.31 |
| 6,749,392 | B1 * | 6/2004 | Adams | B66C 1/62 294/106 |
| 8,109,550 | B1 * | 2/2012 | Benjamin | B66C 1/425 294/110.1 |

FOREIGN PATENT DOCUMENTS

| | | |
|---|---|---|
| CN | 201071198 | 6/2008 |
| CN | 101366110 A | 2/2009 |
| CN | 202189821 U | 4/2012 |
| CN | 102502251 | 6/2012 |
| CN | 202807624 | 3/2013 |
| CN | 103094172 A | 5/2013 |
| CN | 103094175 A | 5/2013 |
| CN | 203048155 | 7/2013 |
| CN | 103600954 A | 2/2014 |
| CN | 103726096 A | 4/2014 |
| JP | S60-72240 A | 4/1985 |
| TW | 422808 | 2/2001 |
| TW | 461010 B | 10/2001 |
| TW | 475234 | 2/2002 |
| TW | 200806444 | 2/2008 |
| TW | 200815263 | 4/2008 |
| TW | 201403746 A | 1/2014 |

OTHER PUBLICATIONS

PCT Opinion & ISR.
International Search Report and Written Opinion in PCT International Application No. PCT/CN2014/076852, dated Aug. 1, 2014.

* cited by examiner

FIXTURE FOR CONVEYING A MASK PLATE FOR THE PRODUCTION OF THIN FILM TRANSISTOR LIQUID CRYSTAL DISPLAY

CROSS-REFERENCE TO RELATED APPLICATION

This application is the U.S. national phase of PCT Application No. PCT/CN2014/076852 filed on May 6, 2014, which claims priority to Chinese Patent Application No. 201310473332.7 filed on Oct. 11, 2013, the disclosures of which are incorporated in their entirety by reference herein.

TECHNICAL FIELD

The present disclosure relates to the field of liquid crystal display technology, in particular to a fixture for conveying a mask plate.

BACKGROUND

Currently, a mask plate for the production of high generation thin film transistor liquid crystal display (TFT-LCD) is generally picked/placed or conveyed manually, and during the conveyance, hands are in direct contact with the mask plate, which thus results in a risk of conveyance damage and poor quality. Especially for a large-size, expensive mask plate, there is a greater risk of being damaged during the conveyance.

SUMMARY

In order to solve the above technical problems, an object of the present disclosure is to provide a fixture for conveying a mask plate, so as to prevent hands from being in direct contact with the mask plate during the conveyance, thereby to prevent the mask plate from being damaged.

In order to achieve the above purpose, the present disclosure provides a fixture for conveying a mask plate, comprising:

a conveying bracket; and a fixation structure that is arranged on the conveying bracket and configured to fix the mask plate to be conveyed.

Alternatively, the fixation structure comprises:

a clamping structure that is clamped to the mask plate to be conveyed; and a connection structure that enables the clamping structure to be switched between a first state where the clamping structure is clamped to a corresponding edge of the mask plate to be conveyed and a second state where the clamping structure is released from the mask plate to be conveyed.

Alternatively, the clamping structure comprises an actuation rod, one end of the actuation rod has a slot into which the edge of the mask plate to be conveyed is clamped, and the other end of the actuation rod is connected to the connection structure.

Alternatively, the connection structure comprises:

a driving rod that is arranged parallel to the mask plate to be conveyed when the clamping structure is in the first state and that is angled relative to the mask plate to be conveyed when the clamping structure is in the second state, a first end of the driving rod being pivotally connected to the conveying bracket;

a transmission rod, one end of the transmission rod is pivotally connected to the end of the driving rod to which the conveying bracket is connected, and the other end of the transmission rod is pivotally connected to the clamping structure; and a sleeve rod that is connected to the conveying bracket and sleeved outside the driving rod and that defines a position of the driving rod when the clamping structure is in the first state, and a junction to be connected to the clamping structure being arranged on the sleeve rod at a position corresponding to the first end of the driving rod.

Alternatively, the actuation rod is provided with a sliding groove, and a via-hole is provided in the transmission rod at a position corresponding to the sliding groove. A screw passes through the sliding groove and the via-hole so as to connect the transmission rod to the actuation rod. The transmission rod is rotated by the driving rod, and the screw moves in the sliding groove so as to drive the actuation rod to be clamped to, or released from, the mask plate to be conveyed.

Alternatively, an elastic member is provided between the sleeve rod and the driving rod so as to maintain a predetermined angle between the driving rod and the sleeve rod when the clamping structure is in the second state.

Alternatively, the fixation structure further comprises a pin extending through a first via-hole in the sleeve rod and a second via-hole in the driving rod, and configured to fix the driving rod to the sleeve rod when the clamping structure is in the first state and release the driving rod from the sleeve rod when the clamping structure is in the second state.

Alternatively, the sleeve rod is a bar-like groove of a U-shaped cross section, and two side walls of the sleeve rod extend outward at a position corresponding to the first end of the driving rod so as to form two junctions that are pivotally connected to the clamping structure.

Alternatively, the conveying bracket is of a #-shaped structure formed by several beams that cross each other, and the fixation structures are arranged at all end portions of the #-shaped structure.

Alternatively, the conveying bracket comprises two long beams and two short beams arranged parallel to each other, respectively, and a reinforcement rib is arranged between the two long beams.

According to the present disclosure, it is able to prevent the hands from being in direct contact with the mask plate, thereby to prevent the mask plate form being damaged during the conveyance and improve the operation efficiency.

DETAILED DESCRIPTION

The structures and principles of the present disclosure will be described hereinafter in conjunction with the drawings. The following embodiments are for illustrative purposes only, but are not used to limit the scope of the present disclosure.

Figure 1:
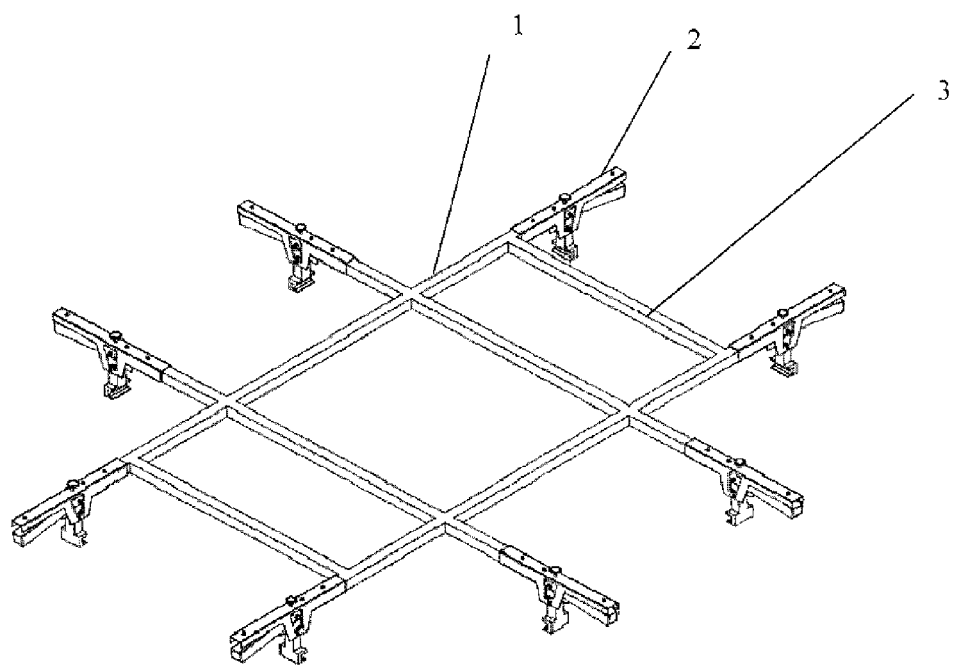
FIG. 1 is a schematic view showing a fixture according to the present disclosure.
Figure 2:
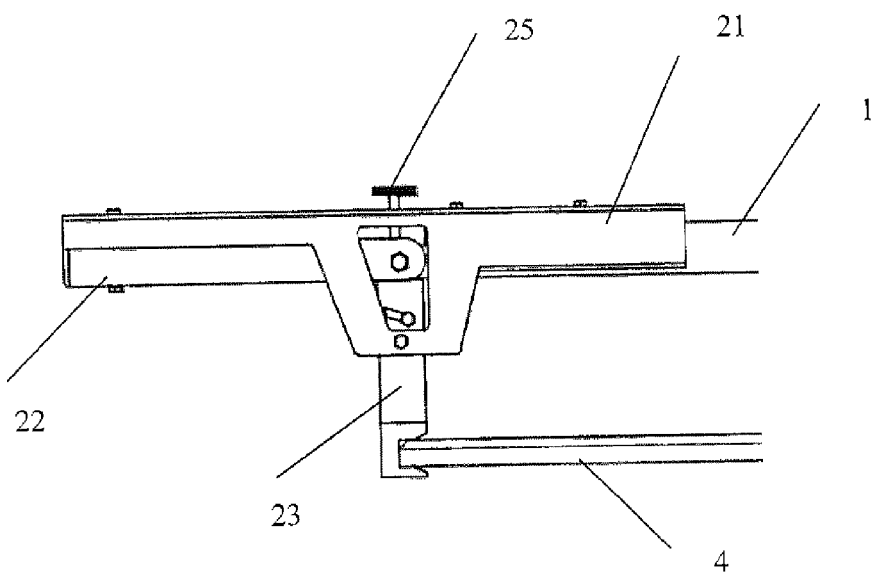
FIG. 2 is a schematic view showing an actuation rod according to the present disclosure when it is in a first state.

As shown in FIGS. 1 and 2, a fixture for conveying a mask plate 4 according to one embodiment of the present disclosure includes:

a conveying bracket; and a fixation structure 2 that is arranged on the conveying bracket and configured to fix the mask plate 4 to be conveyed.

According to the fixture for conveying the mask plate 4 of this embodiment, it is able to prevent hands from being in direct contact with the mask plate 4, thereby to eliminate the pollution on the mask plate 4 due to the hands, reduce the risk of conveyance damage of the mask plate 4, and improve the operation efficiency.

In an embodiment of the present disclosure, the above-mentioned technical effect will be achieved as long as the fixation structure 2 can fix the mask plate 4 to be conveyed, so there may be various forms of the fixation structure 2, which used in the present embodiment will be described in details hereinafter.

Figure 3:
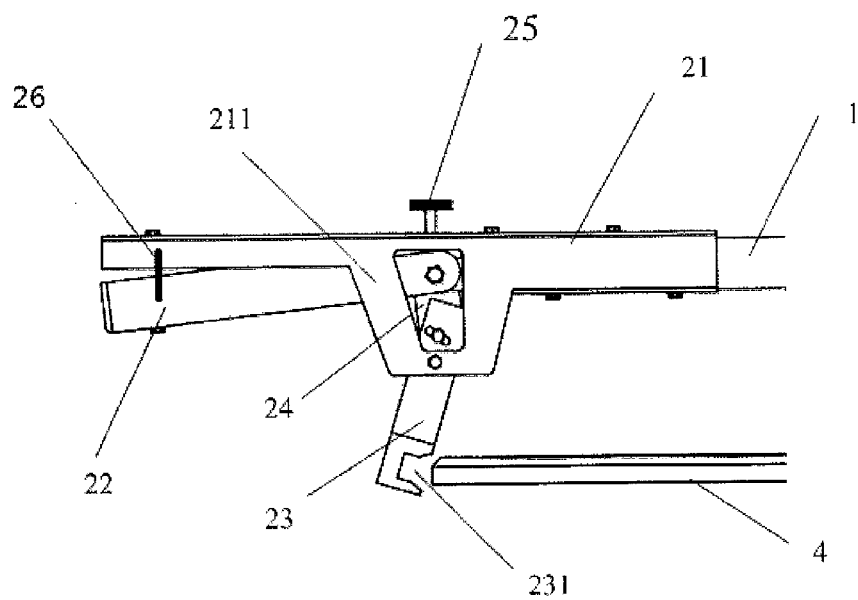
FIG. 3 is a schematic view showing the actuation rod according to the present disclosure when it is in a second state.

As shown in FIGS. 2 and 3, the fixation structure 2 includes:

a clamping structure that can be clamped to the mask plate 4 to be conveyed; and a connection structure that enables the clamping structure to be switched between a first state where the clamping structure is clamped to a corresponding edge of the mask plate 4 to be conveyed and a second state where the clamping structure is released from the mask plate 4 to be conveyed.

The mask plate 4 is fixed in a clamping manner, so as to prevent the mask plate 4 from being damaged.

The above technical effect will be achieved as long as the clamping structure can be clamped to the mask plate to be conveyed, and can be switched between the first state and the second state under the control of the connection structure, so there may be various forms of the clamping structure. In this embodiment, the clamping structure includes an actuation rod 23, one end of which has a slot 231 into which the edge of the mask plate 4 to be conveyed can be clamped, and the other end of which is connected to the connection structure. The structure of the fixture for conveying the mask plate will be described hereinafter on the basis of the actuation rod 23.

In this embodiment, a width of the slot 231 is adapted to a thickness of the mask plate 4 to be conveyed, so as to tightly clamp the mask plate 4.

The connection structure includes:

a driving rod 22 that is arranged parallel to the mask plate 4 to be conveyed (the mask plate to be conveyed is generally placed horizontally) when the actuation rod 23 is in the first state and that is angled relative to the mask plate to be conveyed when the actuation rod 23 is in the second state, a first end of the driving rod 22 being pivotally connected to a corresponding beam 1 on the conveying bracket;

a transmission rod 24, one end of which is pivotally connected to the end of the driving rod 22 to which the conveying bracket is connected, and the other end of which is pivotally connected to the actuation rod 23; and a sleeve rod 21 that defines a position of the driving rod 22 when the actuation rod 23 is in the first state, the sleeve rod 21 being connected to the conveying bracket and sleeved outside the driving rod 22, and a junction 211 to be connected to the actuation rod 23 being arranged on the sleeve rod 21 at a position corresponding to the first end of the driving rod 22.

The fixation structure 2 of this embodiment functions in the same way as a crank slider mechanism as to fix and release the mask plate 4 to be conveyed. The driving rod 22 is arranged perpendicular to the transmission rod 24, the driving rod 22 is pivotally connected to the corresponding beam 1, the transmission rod 24 is pivotally connected to the actuation rod 23, and the actuation rod 23 is pivotally connected to the sleeve rod 21. The sleeve rod 21 is used to fix the actuation rod 23, so as to ensure that a driving power of the actuation rod 23 is merely the force transferred from the transmission rod 24, thereby to ensure a movement direction and a movement angle of the actuation rod 23.

The driving rod 22 moves towards the sleeve rod 21 until it is parallel to the sleeve rod 21, and then drives the transmission rod 24 to rotate. The actuation rod 23 is driven by the transmission rod 24 so as to move towards the mask plate 4 to be conveyed until the corresponding edge of the mask plate 4 to be conveyed is clamped into the slot 231, i.e., the actuation rod 23 is in the first state as shown in FIG. 2. The driving rod 22 moves away from the sleeve rod 21, and drives the transmission rod 24 to move in a reverse direction. The actuation rod 23 is driven by the transmission rod 24 to move in a reverse direction too, so as to release the mask plate 4 from the slot 231, i.e., the actuation rod 23 is in the second state as shown in FIG. 3.

In this embodiment, the actuation rod 23 is provided with a sliding groove, and a via-hole is provided in the transmission rod 24 at a position corresponding to the sliding groove. A screw passes through the sliding groove and the via-hole so as to connect the transmission rod 24 to the actuation rod 23. The transmission rod 24 is rotated by the driving rod 22, and the screw moves in the sliding groove so as to drive the actuation rod 23 to be clamped to, or released from, the mask plate 4 to be conveyed.

In order to ensure a comfortable feel when the driving rod 22 is operated manually and to cushion an impact generated when the mask plate 4 to be conveyed is clamped into the slot 231, an elastic member 26 is provided between the sleeve rod 21 and the driving rod 22 so as to maintain a predetermined angle between the driving rod 22 and the sleeve rod 21 when the actuation rod 23 is in the second state.

Figure 4:
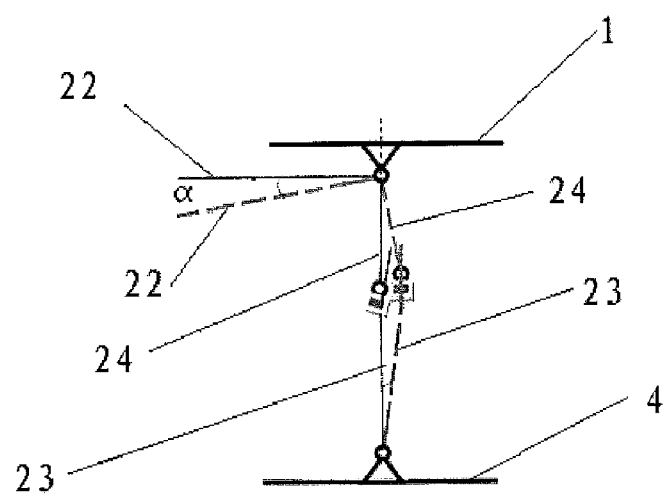
FIG. 4 is a sketch showing the fixture according to the present disclosure.

In FIG. 4, the solid lines represent the driving rod 22, the transmission rod 24 and the actuation rod 23 when the actuation rod 23 is in the first state, while the broken lines represent the driving rod 22, the transmission rod 24 and the actuation rod 23 when the actuation rod 23 is in the second state.

In this embodiment, the elastic member is a spring, so as to define a movement range of the driving rod 22, thereby to effectively control the movement range of the actuation rod 23. When the actuation rod 23 is in the first state, the driving rod 22 is parallel to the sleeve rod 21. At this time, the actuation rod 23 is arranged perpendicular to the driving rod 22, i.e., to the mask plate 4 to be conveyed, and the mask plate 4 to be conveyed is clamped into the slot 231. When the actuation rod 23 is in the second state, there is an angle, e.g., angle α as shown in FIG. 4, between the driving rod 22 and the sleeve rod 21, so as to reduce the contact pressure when the mask plate 4 to be conveyed is clamped into the slot 231 and cushion the impact of the mask plate 4 to be conveyed on the slot 231, thereby to prevent the mask plate 4 and the slot 231 from being damaged and prolong the service life of the fixture for conveying the mask plate 4.

In order to avoid unfirm engagement between the slot 231 and the mask plate 4 when the actuation rod 23 is in the first state, it is required to maintain the actuation rod 23 in the first state during the conveyance of the mask plate 4. The fixation structure 2 further includes a pin 25 extending through a first via-hole in the sleeve rod 21 and a second via-hole in the driving rod 22 and configured to fix the driving rod 22 to the sleeve rod 21 when the actuation rod 23 is in the first state and release the driving rod 22 from the sleeve rod 21 when the actuation rod 23 is in the second state.

In this embodiment, the sleeve rod 21 is a bar-like groove of a U-shaped cross section, and two side walls of the sleeve rod 21 extend outward at a position corresponding to the first end of the driving rod 22 so as to form two junctions 211. A portion of the actuation rod 23 is located between the junctions 211, and the actuation rod 23 is pivotally connected to both of the junctions 211.

The end of the actuation rod 23 that is not provided with the slot 231 is pivotally connected to the transmission rod 24. According to the practical need, a joint on the actuation rod 23 to which the junction 211 is connected is separated from the slot 231 by a predetermined distance, so as to fix the actuation rod 23, thereby to facilitate the control of the movement direction and movement angle of the actuation rod 23.

In a embodiment of the present disclosure, the above technical effect will be achieved as long as the conveying bracket can be provided with the fixation structure 2, and can include a part to be handhold by an operator when the mask plate 4 is conveyed manually or a part to be clamped when the mask plate 4 is conveyed by a special tool. Hence, there may be various forms of the conveying bracket, and some possible forms will be described hereinafter.

In one embodiment, the conveying bracket includes at least two beams 1 arranged parallel to each other and connected to each other via a connection rod. Each beam 1 is provided at both ends with the fixation structures 2. When the mask plate 4 is being conveyed, the fixation structures 2 at both ends of each beam 1 are connected to the opposite ends of the mask plate 4, respectively, so as to fix the mask plate 4, and facilitate the conveyance thereof.

However, merely two opposite ends of the mask plate 4 are fixed, and if the mask plate 4 is tilted during the conveyance, there is a risk that the mask plate 4 will be disengaged from the fixation structure 2. In order to further ensure the safety of the mask plate 4 during the conveyance, as shown in FIG. 1, the conveying bracket in this embodiment is of a #-shaped structure formed by several beams 1 that cross each other, and the fixation structures 2 are arranged at each end portion of the #-shaped structure.

In other words, either end of the beam 1 is pivotally connected to the driving rod 22 of the corresponding fixation structure 2. When the actuation rod 23 is in the first state, the driving rod 22 is parallel to the corresponding beam 1, and when the actuation rod 23 is in the second state, there is an angle, i.e., angle α as shown in FIG. 4, between the driving rod 22 and the corresponding beam 1, so as to control the movement range and the movement direction of the actuation rod 23.

When the mask plate 4 is being conveyed, all edges of the mask plate 4 are fixed, and even if the mask plate 4 is tilted during the conveyance, it is still able to prevent the mask plate 4 form being damaged due to the slippage, and even the drop, of the mask plate 4, thereby to ensure the safety of the mask plate 4 during the conveyance.

In order to be adapted to a size of the mask plate 4, the conveying bracket includes two long beams 1 and two short beams 1 arranged parallel to each other, respectively. In addition, as shown in FIG. 1, a reinforcement rib 3 is arranged between the long beams 1 so as to strengthen the conveying bracket.

As shown in FIG. 4, which is a sketch showing the fixture according to the present disclosure, the fixture for conveying the mask plate 4 includes two parts (i.e., a part 1 including the driving rod 22 and the transmission rod 24, and a part 2 including the actuation rod 23), two lower pairs, and one higher pair. In the field of mechanical engineering, the term "higher pair mechanism" or "higher pair" for short refers to a kinematic pair consisting of two elements in point or line contact, e.g., a gear pair and a cam pair. In contrast, the term "lower pair mechanism" refers to a kinematic pair consisting of two elements in surface contact. In this embodiment, the two lower pairs include a first kinematic pair consisting of the driving rod 22 and the beam 1, and a second kinematic pair consisting of the transmission rod 24 and the actuation rod 23. The higher pair includes a kinematic pair consisting of the actuation rod 23 and the mask plate 4. In this embodiment, a degree of freedom (Fn) of the fixture for conveying the mask plate 4 is $Fn=3*2-2*2-1=1$ (a degree of freedom of the first kinematic pair is 3, a degree of freedom of the second kinematic pair is 2, and a degree of freedom of the higher pair mechanism is 1). In other words, merely a driving force generated by the movement of the driving rod 22 is required to enable the fixture to fix or release the mask plate 4 to be conveyed, and thereby it is able to facilitate the conveyance of the mask plate 4.

The above are merely the alternative embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A fixture for conveying a mask plate, comprising:
   a conveying bracket; and
   a fixation structure that is arranged on the conveying bracket and configured to fix the mask plate to be conveyed,
   wherein the fixation structure comprises:
   a clamping structure that is clamped to the mask plate to be conveyed; and
   a connection structure that enables the clamping structure to be switched between a first state where the clamping structure is clamped to a corresponding edge of the mask plate to be conveyed and a second state where the clamping structure is released from the mask plate to be conveyed,
   wherein the clamping structure comprises an actuation rod, one end of the actuation rod has a slot into which the edge of the mask plate to be conveyed is clamped, and the other end of the actuation rod is connected to the connection structure,
   wherein the connection structure comprises:
   a driving rod that is arranged parallel to the mask plate to be conveyed when the clamping structure is in the first state and that is angled relative to the mask plate to be conveyed when the clamping structure is in the second state, a first end of the driving rod being pivotally connected to the conveying bracket;
   a transmission rod, one end of the transmission rod is pivotally connected to the end of the driving rod to which the conveying bracket is connected, and the other end of the transmission rod is pivotally connected to the clamping structure; and
   a sleeve rod that is connected to the conveying bracket and sleeved outside the driving rod and that defines a position of the driving rod when the clamping structure is in the first state, and a junction to be connected to the clamping structure being arranged on the sleeve rod at a position corresponding to the first end of the driving rod.

2. The fixture according to claim 1, wherein the actuation rod is provided with a sliding groove, and a via-hole is provided in the transmission rod at a position corresponding to the sliding groove, a screw passes through the sliding groove and the via-hole so as to connect the transmission rod to the actuation rod, the transmission rod is rotated by the driving rod, and the screw moves in the sliding groove so as to drive the actuation rod to be clamped to, or released from, the mask plate to be conveyed.

3. The fixture according to claim 2, wherein the conveying bracket is of a #-shaped structure formed by several beams that cross each other, and the fixation structures are arranged at all end portions of the #-shaped structure.

4. The fixture according to claim 1, wherein an elastic member is provided between the sleeve rod and the driving rod so as to maintain a predetermined angle between the driving rod and the sleeve rod when the clamping structure is in the second state.

5. The fixture according to claim 4, wherein the conveying bracket is of a #-shaped structure formed by several beams that cross each other, and the fixation structures are arranged at all end portions of the #-shaped structure.

6. The fixture according to claim 1, wherein the fixation structure further comprises a pin extending through a first via-hole in the sleeve rod and a second via-hole in the driving rod, and configured to fix the driving rod to the sleeve rod when the clamping structure is in the first state and release the driving rod from the sleeve rod when the clamping structure is in the second state.

7. The fixture according to claim 6, wherein the conveying bracket is of a #-shaped structure formed by several beams that cross each other, and the fixation structures are arranged at all end portions of the #-shaped structure.

8. The fixture according to claim 1, wherein the sleeve rod is a bar-like groove of a U-shaped cross section, and two side walls of the sleeve rod extend outward at a position corresponding to the first end of the driving rod so as to form two junctions that are pivotally connected to the clamping structure.

9. The fixture according to claim 8, wherein the conveying bracket is of a #-shaped structure formed by several beams that cross each other, and the fixation structures are arranged at all end portions of the #-shaped structure.

10. The fixture according to claim 1, wherein the conveying bracket is of a #-shaped structure formed by several beams that cross each other, and the fixation structures are arranged at all end portions of the #-shaped structure.

11. The fixture according to claim 10, wherein the conveying bracket comprises two long beams and two short beams arranged parallel to each other, respectively, and a reinforcement rib is arranged between the two long beams.

12. A fixture for conveying a mask plate, comprising:
a conveying bracket; and
a fixation structure that is arranged on the conveying bracket and configured to fix the mask plate to be conveyed,
wherein the conveying bracket is of a #-shaped structure formed by several beams that cross each other, and the fixation structures are arranged at all end portions of the #-shaped structure.

13. The fixture according to claim 12, wherein the conveying bracket comprises two long beams and two short beams arranged parallel to each other, respectively, and a reinforcement rib is arranged between the two long beams.

14. A fixture for conveying a mask plate, comprising:
a conveying bracket; and
a fixation structure that is arranged on the conveying bracket and configured to fix the mask plate to be conveyed,
wherein the fixation structure comprises:
a clamping structure that is clamped to the mask plate to be conveyed; and
a connection structure that enables the clamping structure to be switched between a first state where the clamping structure is clamped to a corresponding edge of the mask plate to be conveyed and a second state where the clamping structure is released from the mask plate to be conveyed,
wherein the conveying bracket is of a #-shaped structure formed by several beams that cross each other, and the fixation structures are arranged at all end portions of the #-shaped structure.

15. The fixture according to claim 14, wherein the conveying bracket comprises two long beams and two short beams arranged parallel to each other, respectively, and a reinforcement rib is arranged between the two long beams.

* * * * *